United States Patent [19]
Sawaya

[11] Patent Number: 5,093,713
[45] Date of Patent: Mar. 3, 1992

[54] SEMICONDUCTOR DEVICE PACKAGE

[75] Inventor: Hiromichi Sawaya, Kawasaki, Japan

[73] Assignee: Kabushiki Kaisha Toshiba, Kawasaki, Japan

[21] Appl. No.: 700,301

[22] Filed: May 8, 1991

Related U.S. Application Data

[63] Continuation of Ser. No. 470,137, Jan. 25, 1990, abandoned.

[30] Foreign Application Priority Data

Jan. 30, 1989 [JP] Japan ................................ 1-20212

[51] Int. Cl.⁵ ............................................ H01L 23/16
[52] U.S. Cl. ........................................ 357/75; 357/74; 357/72
[58] Field of Search ............................ 357/74, 75, 72

[56] References Cited

U.S. PATENT DOCUMENTS

| | | | |
|---|---|---|---|
| 3,639,770 | 2/1972 | Zizelmann | 357/75 |
| 3,715,633 | 2/1973 | Nier | 357/75 |
| 3,935,501 | 1/1976 | Sterbal | 357/75 |
| 4,032,964 | 6/1977 | Boeters | 357/75 |
| 4,128,801 | 12/1978 | Gansert | 357/75 |
| 4,203,792 | 4/1980 | Thompson | 357/75 |

FOREIGN PATENT DOCUMENTS 60-41249 3/1985 Japan .

Primary Examiner—Eugene R. LaRoche
Assistant Examiner—R. Ratliff
Attorney, Agent, or Firm—Oblon, Spivak, McClelland, Maier & Neustadt

[57] ABSTRACT

A semiconductor device package includes a first semiconductor chip. The first semiconductor chip is mounted on a substrate island region. A lead frame is arranged to serve as an external terminal of the first semiconductor chip, and includes an island region for mounting at least one second semiconductor chip.

13 Claims, 1 Drawing Sheet

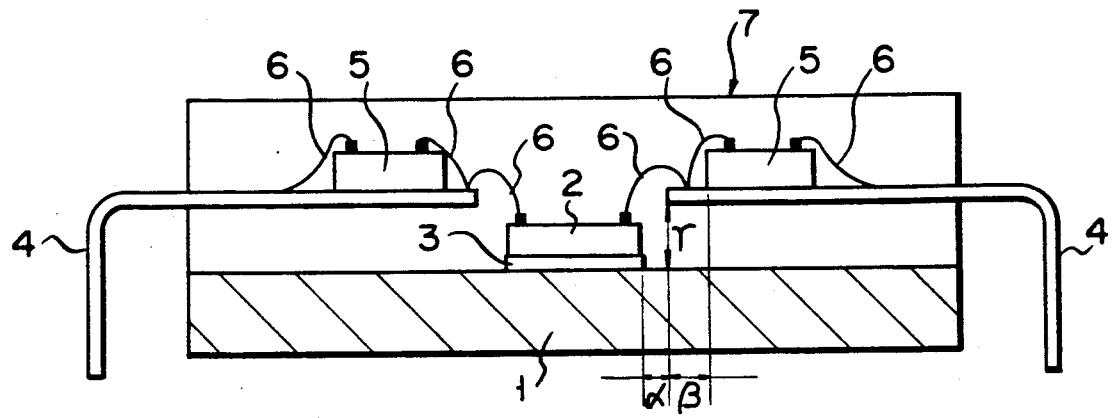
F I G. 1
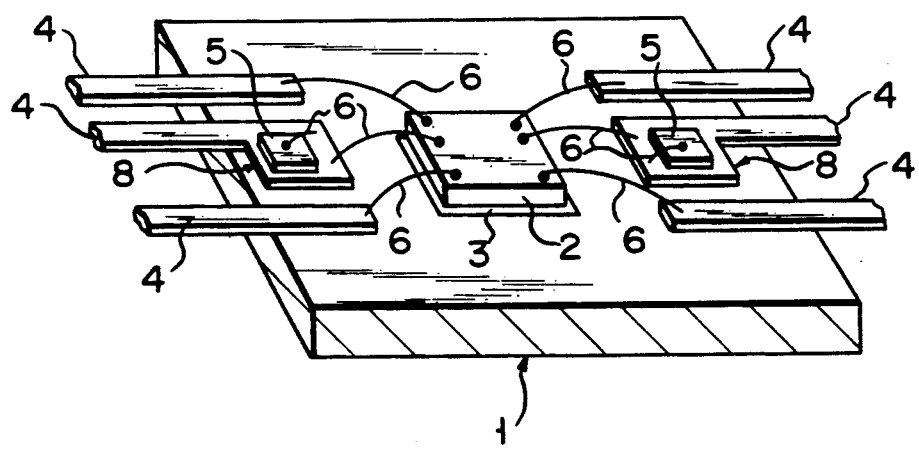
F I G. 2

SEMICONDUCTOR DEVICE PACKAGE

This application is a continuation of application Ser. No. 07/470,137 filed on June 25, 1990, now abandoned.

BACKGROUND OF THE INVENTION

1. Field of the Invention

The present invention relates to a semiconductor device and, more particularly, to a semiconductor device package wherein large- and small-current semiconductor chips are formed in a single package.

2. Description of the Related Art

In a conventional resin-sealed semiconductor device package for a large-current semiconductor chip, a heat-radiation fin is disposed, and a large-current semiconductor chip is placed on the fin. According to such a resin-sealed semiconductor package wherein a large-current semiconductor chip is placed on a heat-radiation fin, heat generated from the semiconductor chip can be dissipated through the heat-radiation fin to achieve a stable function of the semiconductor chip, and to prevent abnormal heating of the chip.

Conventionally, however, a region on a heat-radiation fin serves as an island region of a semiconductor chip, and only a large-current semiconductor chip is placed on the island region. A small-current semiconductor chip which generates less heat is formed in another package. These large- and small-current semiconductor chips cannot be contained in a single package for the following reason. First, since the chips are formed on the heat-radiation fin, heat is rapidly conducted, and the small-current semiconductor chip may be adversely affected by heat generation from the large-current semiconductor chip, thus degrading the characteristics of the small-current semiconductor chip. Second, a conductive adhesive is conventionally used to fix a small-current semiconductor chip to a substrate. The conductive adhesive has a poorer heat resistance than that of a solder or an AuSi eutectic for fixing a large-current semiconductor chip. In regard to this problem, it may be proposed to fix the small-current semiconductor chip to the heat-radiation fin by, e.g., a solder. However, the small-current semiconductor chip normally has a micropatterned and complicated, e.g., multi-layered, element structure. Therefore, the small-current semiconductor chip cannot withstand a high temperature generated when it is fixed by, e.g., a solder, and may be broken.

As described above, large- and small-current semiconductor chips cannot be simultaneously placed on a heat-radiation fin to be contained in a singe package, and a demand for high-integration packaging cannot be satisfied.

SUMMARY OF THE INVENTION

It is, therefore, an object of the present invention to provide a semiconductor device package in which large- and small-current semiconductor chips are included in a single package to realize high-integration packaging.

In order to achieve the above object, according to the present invention, there is provided a semiconductor device package comprising a first semiconductor chip, a substrate island region for mounting the first semiconductor chip, and a lead frame means, arranged to serve as an external terminal of the first semiconductor chip, and including an island region for mounting at least one second semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates a presently preferred embodiment of the invention and, together with the general description given above and the detailed description of the preferred embodiment given below, serves to explain the principles of the invention.

The above-mentioned aspects and other features of the present invention will be described hereinafter in detail with reference to the accompanying drawings.

FIG. 1 is a sectional view of a semiconductor device package according to an embodiment of the present invention; and FIG. 2 is a perspective view of the semiconductor device package shown in FIG. 1.

DETAILED DESCRIPTION OF THE PREFERRED EMBODIMENT

A semiconductor device package according to an embodiment of the present invention will be described hereinafter with reference to FIGS. 1 and 2.

FIG. 1 is a sectional view of the semiconductor device package according to an embodiment of the present invention, and FIG. 2 is a perspective view of the semiconductor device package shown in FIG. 1.

Referring to FIG. 1, a large-current semiconductor chip 2 is placed on and fixed to a heat-radiation fin 1 as a substrate island by a solder 3. Lead frames 4 are arranged to serve as external terminals of the semiconductor device package. A small-current semiconductor chip, e.g., a logic-circuit semiconductor chip 5, is fixed to each corresponding lead frame 4 by a conductive adhesive. The logic-circuit semiconductor chip 5 is thermally and electrically insulated from the large-current chip 2 by a resin 7. Bonding wires 6 are used as a means for electrically connecting these electrically insulated semiconductor chips 2 and 5 to each other. In addition, each part is sealed by the resin 7 to form the semiconductor device package according to an embodiment of the present invention.

The semiconductor device package according to the embodiment of the present invention will be described below in detail with reference to a perspective view in FIG. 2 of the device in FIG. 1. The same reference numerals in FIG. 2 correspond to the same parts as in FIG. 1.

In FIG. 1, the upper limit of a distance $a$ along the surface of the substrate island region between a side end of the semiconductor chip 2 and a distal end of the lead frame 4 is set to be 2.5 to 3 mm, and the lower limit thereof is set to be 0.5 mm in consideration of the parts precision and manufacturing conditions such as a scrubbing amplitude. The distance c is preferably set to be about 1 mm. A distance $a$ between the distal end of the lead frame 4 and the semiconductor chip 5 is preferably set to be about 1.4 mm, and the lower limit thereof is set to be 0.9 mm. In addition, a height T of the lead frame 4 from the surface of the heat-radiation fin 1 must be at least about 0.5 mm.

As shown in FIG. 2, an island region 8 is formed on a part of the lead frame 4. A chip can be placed on the island region 8 to be spaced apart from the heat-radiation fin 1. A small-current semiconductor chip, i.e., the logic-circuit semiconductor chip 5 in this embodiment, is arranged on the island region 8.

In the semiconductor device package with the above arrangement, the logic-circuit semiconductor chip 5 is placed on the island region 8 on the lead frame 4 which is spaced apart from the heat-radiation fin 1. Therefore, the logic-circuit semiconductor chip 5 is not adversely affected by heat generated by the large-current semiconductor chip 2. In addition, electrical and thermal insulation is achieved by the resin 7. This means that an insulating substrate for insulating different semiconductor chips is not required, thus achieving a decrease in manufacturing cost. Since the two semiconductor chips are placed at different places, a method of bonding the chip to the heat-radiation fin 1 can be different from a method of bonding the chip to the island region 8. For example, the large-current semiconductor chip 2 can be bonded to the heat-radiation fin 1 by a solder, and the logic-circuit semiconductor chip 5 can be bonded to the island region 8 by a conductive adhesive. In addition, the conductive adhesive is free from an influence of heat. This also applies when large-current semiconductor chips are bonded to the corresponding member by different bonding methods. For example, a chip can be bonded to the heat-radiation fin 1 using an AuSi eutectic alloy method, and a chip can be bonded to the island region 8 using a solder bonding method. At this time, in the large-current semiconductor chip on the island region 8, the lead frame 4 is utilized as a heat sink. In addition, for example, when the logic-circuit semiconductor chip 5 is bonded to the island region 8, the lead frame 4 and the logic-circuit semiconductor chip 5 can be fixed by calking utilizing a small thickness of the lead frame 4. In this case, when the lead frame 4 and the logic-circuit chip 5 are fixed by calking in advance in the manufacturing process, the semiconductor device of the present invention can be assembled without providing the step of calking in addition to the conventional wire bonding step, and an adhesive is not required. Therefore, the semiconductor device in the package can be protected from contamination with impurity ions in the adhesive. Since the island region 8 is spaced and insulated from the heat-radiation fin 1, semiconductor chips each having a different substrate potential can be placed in a single package. In addition, when a physically weak semiconductor chip, including, e.g., a resistor, a transistor, and a capacitor each having characteristics which are easily changed by strain stress such as thermal or mechanical stress, is arranged on the island region 8 above the heat-radiation fin 1, the strain stress can be relaxed because the thickness of the resin 7 is small, thus suppressing variations in characteristics.

Note that although an arrangement of a DIP (dual in-line package)-type semiconductor device package has been described above in this embodiment, the present invention can be similarly applied to an SIP (single in-line package)-type semiconductor package or another semiconductor package having lead frames, as a matter of course.

In addition, the present invention can be applied to a package using a surface mount technology, i.e a QFP (quad flat package), a PLCC (plastic leaded chip carrier), an SOP (small outline package), and the like.

As described above, when island regions for semiconductor chips are arranged on lead frame spaced apart from a heat-radiation fin, a semiconductor device wherein large- and small-current semiconductor chips are included in a single package can be provided. One semiconductor package can drive a relatively large-sized mechanical electronic part such as a motor, and allows exchange of data with a CPU. In particular, this semiconductor device package is useful for a large-scale system.

Not only in a package including a heat-radiation fin, but also in a package having conventional substrate island regions, when the island regions are arranged on lead frames which are spaced from each other, semiconductor chips having different substrate potentials can be included in a single package, or different methods of bonding semiconductor chips can be used. In addition, since the semiconductor chips can be insulated from each other by a resin, an insulating sheet for insulating the chips is not required, thus achieving a decrease in manufacturing cost. Furthermore, when a physically weak semiconductor chip is placed on an island region formed near the surface of the resin, strain stress applied on the semiconductor chip can be decreased in accordance with the thickness of the resin, thus realizing high reliability. In an intermediate power semiconductor chip which generates a relatively small amount of heat, a lead frame can be utilized as a heat sink without using a heat-radiation fin. Thus, there is provided a semiconductor device package which allows easy design with flexibility.

Additional advantages and modifications will readily occur to those skilled in the art. Therefore, the invention in its broader aspects is not limited to the specific details, representative devices, and illustrated examples shown and described. Accordingly, departures may be made from such details without departing from the spirit or scope of the general inventive concept as defined by the appended claims and their equivalents.

What is claimed is:

1. A resin-sealed semiconductor device package, comprising:
   a first semiconductor chip;
   a substrate island region for mounting said first semiconductor chip;
   lead frame means, arranged to serve as an external terminal of said first semiconductor chip, and including an island region for mounting at least one second semiconductor chip; and
   a resin layer for thermally and electrically insulating said second semiconductor chip from said a first semiconductor chip.

2. A package according to claim 1, wherein said substrate island region constitutes a heat-radiation fin.

3. A package according to claim 1, which further comprises a solder layer for fixing said first semiconductor chip to said substrate island region.

4. A package according to claim 1, which further comprises a bonding wire for electrically connecting said first and second semiconductor chips.

5. A package according to claim 1, wherein an upper limit of a distance along a surface of said substrate island region between an end of said first semiconductor chip and a distal end of said lead frame means is 2.5 to 3 mm, and a lower limit thereof is 0.5 mm.

6. A package according to claim 1, wherein a distance along a surface of said substrate island region between an end of said first semiconductor chip and a distal end of said lead frame means is about 1 mm.

7. A package according to claim 1, wherein a distance from a distal end of said lead frame means to said second semiconductor chip is about 1.4 mm.

8. A package according to claim 1, wherein a height of said lead frame means from a surface of said substrate island region is about 0.5 mm.

9. A package according to claim 1, wherein said first and second semiconductor chips are bonded by different methods.

10. A package according to claim 11, wherein said first semiconductor chip is fixed by a solder bonding method, and said second semiconductor chip is fixed by a conductive adhesive.

11. A package according to claim 11, wherein said first semiconductor chip is bonded by an AuSi eutectic alloy method, and said second semiconductor chip is 12. A package according to claim 1, wherein said second semiconductor chip is fixed by calking.

13. A package according to claim 1, wherein said first semiconductor chip has a first substrate potential, and secured semiconductor chip has a second substrate potential different from the first substrate potential.

* * * * *